United States Patent
Narishige

(10) Patent No.: US 7,622,393 B2
(45) Date of Patent: Nov. 24, 2009

(54) METHOD AND APPARATUS FOR MANUFACTURING A SEMICONDUCTOR DEVICE, CONTROL PROGRAM THEREOF AND COMPUTER-READABLE STORAGE MEDIUM STORING THE CONTROL PROGRAM

(75) Inventor: Kazuki Narishige, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 336 days.

(21) Appl. No.: 11/514,904

(22) Filed: Sep. 5, 2006

(65) Prior Publication Data

US 2007/0105389 A1    May 10, 2007

Related U.S. Application Data

(60) Provisional application No. 60/740,252, filed on Nov. 29, 2005.

(30) Foreign Application Priority Data

Nov. 4, 2005    (JP) .............................. 2005-320345

(51) Int. Cl.
*H01L 21/302* (2006.01)

(52) U.S. Cl. .................. 438/710; 438/711; 438/723; 438/724; 438/756; 438/757; 257/E21.218

(58) Field of Classification Search ................. 438/710, 438/711, 714, 723, 724, 727, 756, 757
See application file for complete search history.

(56) References Cited

U.S. PATENT DOCUMENTS

| 7,049,244 B2* | 5/2006 | Becker et al. ............... 438/714 |
| 2005/0277289 A1* | 12/2005 | Wagganer et al. ........... 438/637 |

FOREIGN PATENT DOCUMENTS

| JP | 2003-229418 | 8/2003 |
| JP | 2004-071732 | 3/2004 |

* cited by examiner

*Primary Examiner*—Hsien-ming Lee
(74) *Attorney, Agent, or Firm*—Oblon, Spivak, McClelland, Maier & Neustadt, L.L.P.

(57) ABSTRACT

A semiconductor device manufacturing method includes a plasma etching process for selectively plasma etching a silicon nitride film against a silicon oxide film formed under the silicon nitride film in a substrate to be processed. The plasma etching process uses an etching gas including a $C_mF_n$ gas (m, n represent integers of 1 or greater) added to a gaseous mixture of a $CH_xF_y$ gas (x, y represent integers of 1 or greater) and $O_2$ gas, wherein the flow rate of the $C_mF_n$ gas is not greater than 10% of that of the $O_2$ gas. The etching gas may further include a rare gas.

13 Claims, 2 Drawing Sheets

METHOD AND APPARATUS FOR MANUFACTURING A SEMICONDUCTOR DEVICE, CONTROL PROGRAM THEREOF AND COMPUTER-READABLE STORAGE MEDIUM STORING THE CONTROL PROGRAM

FIELD OF THE INVENTION

The present invention relates to a semiconductor device manufacturing method including a process for selectively plasma etching a silicon nitride film against a silicon oxide film, a semiconductor device manufacturing apparatus, a control program and a computer-readable storage medium storing the control program.

BACKGROUND OF THE INVENTION

Conventionally, a manufacturing process for a semiconductor device involves a processing step for selectively plasma etching a silicon nitride film such as a SiN film against an underlying silicon oxide film such as a $SiO_2$ film or a SiOC film (carbon-added silicon oxide film). In this regard, there has been known a technique for improving the selectivity of the silicon nitride film against the silicon oxide film (the ratio of an etching rate of the silicon nitride film to an etching rate of the silicon oxide film) by using a gaseous mixture of, e.g., $CH_3F$ and $O_2$ as an etching gas (see, for example, Japanese Patent Laid-open Publication No. 2003-229418).

As mentioned above, it has been well known to selectively etch a silicon nitride film against a silicon oxide film by using, e.g., a gaseous mixture of $CH_3F$ and $O_2$ as an etching gas. Further, it has been also known that the plasma can be stabilized by adding a rare gas (e.g., Ar) to the etching gas as a dilution gas.

In the above method, an addition of $O_2$ gas increases the selectivity of the silicon nitride film against the silicon oxide film, since the $O_2$ gas contained in the etching gas hardly contributes to the etching of the silicon oxide film. When the selectivity of the silicon nitride film against the silicon oxide film is increased by adding oxygen to the etching gas, however, a micro mask in the form of fine irregularities would be formed on the surface of the silicon nitride film, which is conjectured to be resulting from oxidation, causing the surface of the silicon nitride film to become rough, which, in turn deteriorates characteristics of the semiconductor device.

SUMMARY OF THE INVENTION

It is, therefore, an object of the present invention to provide a semiconductor device manufacturing method and apparatus capable of preventing a generation of roughness on a silicon nitride film surface while maintaining the selectivity of the silicon nitride film against a silicon oxide film; a control program thereof; and a computer-readable storage medium storing the control program.

In accordance with an aspect of the present invention, there is provided a method for manufacturing a semiconductor device, including: a plasma etching process for selectively plasma etching a silicon nitride film against a silicon oxide film formed under the silicon nitride film in a substrate to be processed, wherein the plasma etching process uses an etching gas including a $C_mF_n$ gas (m, n represent integers of 1 or greater) added to a gaseous mixture of a $CH_xF_y$ gas (x, y represent integers of 1 or greater) and $O_2$ gas, a flow rate of the $C_mF_n$ gas being not greater than 10% of that of the $O_2$ gas.

Preferably, a spacer made of the silicon nitride film is formed at a gate by plasma etching the silicon nitride film.

Preferably, the $CH_xF_y$ gas is $CH_3F$ gas or $CH_2F_2$ gas.

Preferably, the $C_mF_n$ gas is $C_2F_6$ gas, $C_3F_8$ gas, $C_4F_6$ gas, $C_4F_8$ gas or $C_5F_8$ gas.

Preferably, the amount of the $C_mF_n$ gas added is set to be not greater than about 8% of the flow rate of the $O_2$ gas.

Preferably, the amount of the $C_mF_n$ gas added is set to be not greater than about 6% of the flow rate of the $O_2$ gas.

Preferably, the etching gas further includes a rare gas.

In accordance with another aspect of the present invention, there is provided an apparatus for manufacturing a semiconductor device, including: a processing chamber for accommodating a substrate to be processed; an etching gas supply unit for supplying an etching gas into the processing chamber; a plasma generating unit for converting the etching gas into a plasma to be used in plasma etching of the substrate; and a control unit for carrying out the aforementioned semiconductor device manufacturing method.

In accordance with still another aspect of the present invention, there is provided a control program, executed on a computer, for controlling a semiconductor device manufacturing apparatus to perform the aforementioned semiconductor device manufacturing method.

In accordance with still another aspect of the present invention, there is provided a computer-readable storage medium for storing therein a control program executed on a computer, wherein the control program controls a plasma processing apparatus to perform the aforementioned semiconductor device manufacturing method.

In accordance with the present invention, it is possible to prevent a generation of roughness on a silicon nitride film surface while maintaining the selectivity of the silicon nitride film against a silicon oxide film.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
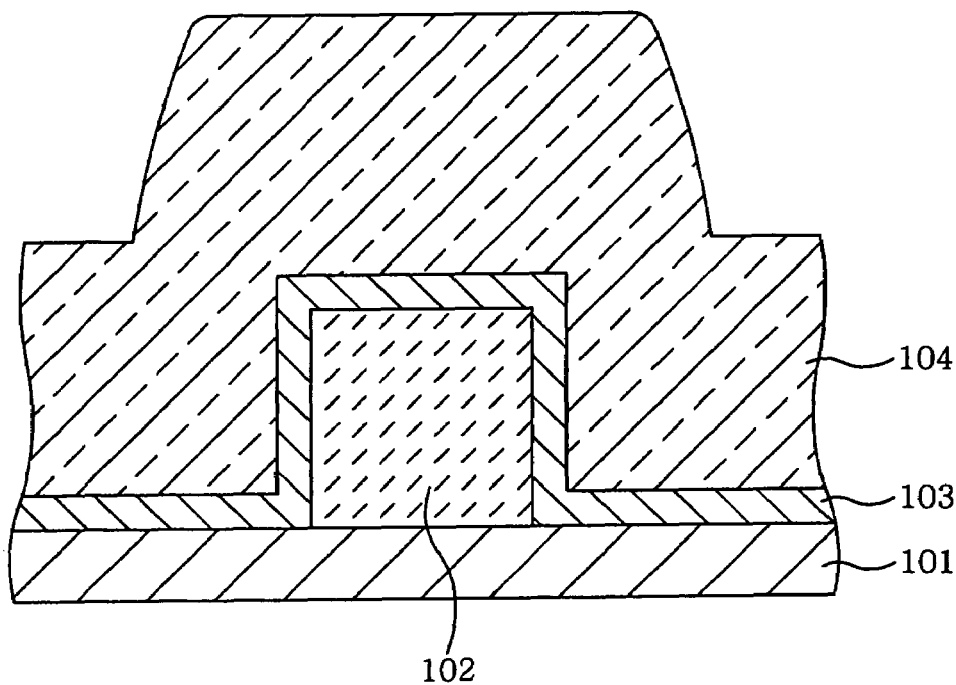
FIGS. 1A and 1B show sectional views of a semiconductor wafer to describe a semiconductor device manufacturing method in accordance with a preferred embodiment of the present invention.
Figure 1B:
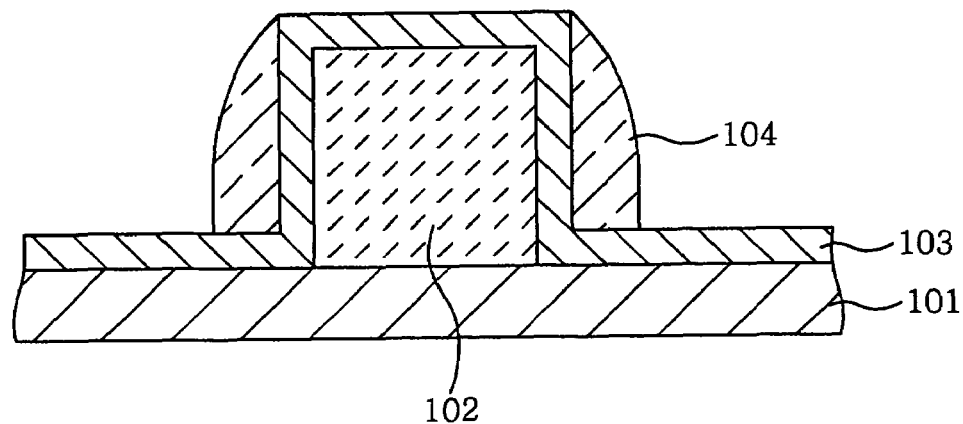
Figure 2:
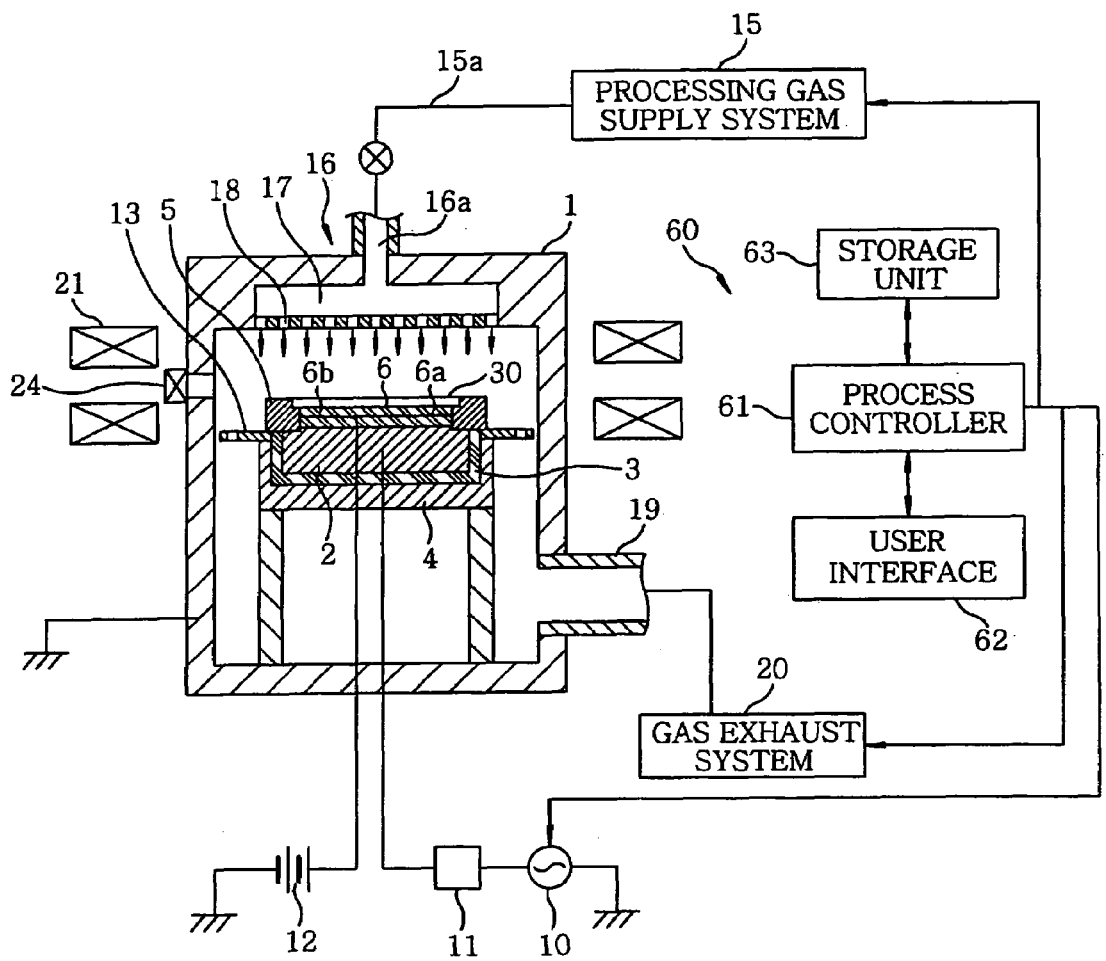
FIG. 2 sets forth a schematic view of a semiconductor device manufacturing apparatus in accordance with the preferred embodiment of the present invention.

Hereinafter, a preferred embodiment of the present invention will be described with reference to the accompanying drawings. FIG. 1 is an enlarged sectional view of a semiconductor wafer which is used as a substrate to be processed in a semiconductor device manufacturing method in accordance with the preferred embodiment of the present invention. Further, FIG. 2 illustrates a configuration of a plasma etching apparatus employed as a semiconductor device manufacturing apparatus in accordance with the preferred embodiment of the present invention. The configuration of the plasma etching apparatus will be first described with reference to FIG. 2.

The plasma etching apparatus includes an airtightly sealed chamber 1 which is electrically grounded. The chamber 1 is of a cylindrical shape, and it is formed of, for example, aluminum. Installed in the chamber 1 is a supporting table 2 for horizontally supporting a semiconductor wafer 30 to be processed. The supporting table 2 is formed of, for example, aluminum and is supported by a conductive support 4 via an insulating plate 3. Also, a focus ring 5 formed of, for example, single crystalline silicon is disposed on the periphery of the top surface of the supporting table 2.

A radio frequency (RF) power supply 10 is connected to the supporting table 2 via a matching box 11 such that a radio frequency power of a predetermined frequency (for instance, 13.56 MHz) is applied to the supporting table 2 from the RF power supply 10. Meanwhile, a shower head 16 is disposed above the supporting table 2 to face it in parallel, the shower head 16 being grounded. Thus, the supporting table 2 and the shower head 16 function as a pair of electrodes.

An electrostatic chuck 6 for electrostatically adsorbing and holding the semiconductor wafer 30 thereon is mounted on the top surface of the supporting table 2. The electrostatic chuck 6 has an electrode 6a embedded in an insulating material 6b, and the electrode 6a is connected to a DC power supply 12. By applying a DC voltage to the electrode 6a from the DC power supply 12, the semiconductor wafer 30 is adsorbed to and held by the electrostatic chuck 6 with the help of a Coulomb force.

A coolant passageway (not shown) is formed within the supporting table 2. By circulating a proper coolant through the coolant passageway, the semiconductor wafer 30 can be controlled to be maintained at a desired temperature level. Also, a gas exhaust ring 13 is installed outside the focus ring 5, and the gas exhaust ring 13 is connected to the chamber 1 via the support 4.

The shower head 16 is disposed at a ceiling portion of the chamber 1 to face the supporting table 2. The shower head 16 is provided with a plurality of gas injection openings 18 in its bottom surface and has a gas inlet 16a in an upper portion thereof. Further, the shower head 16 has an internal space 17 formed therein. A gas supply line 15a is connected at one end to the gas inlet 16a, and the other end of the gas supply line 15a is connected to a processing gas supply system 15 for supplying a processing gas for etching (i.e., an etching gas).

The processing gas is introduced into the internal space 17 of the shower head 16 from the processing gas supply system 15 via the gas supply line 15a and the gas inlet 16a, and is injected toward the semiconductor wafer 30 through the gas injection openings 18. In accordance with the preferred embodiment of the present invention, the processing gas supply system supplies an etching gas including a $C_mF_n$ gas (m, n represent integers of 1 or greater) added to a gaseous mixture of at least a $CH_xF_y$ gas (x, y represent integers of 1 or greater) and $O_2$ gas, wherein the flow rate of the $C_mF_n$ gas is no greater than 10% of that of the $O_2$ gas. The etching gas may further include a rare gas such as Ar gas or He gas.

A gas outlet port 19 is formed at a lower portion of the chamber 1, and a gas exhaust system 20 is connected to the gas outlet port 19. By operating a vacuum pump of the gas exhaust system 20, the chamber 1 can be depressurized to a predetermined vacuum level. Further, a gate valve 24 for opening and closing a loading/unloading port for the wafer 30 is installed at a sidewall of the chamber 1.

Also, a ring magnet 21 is concentrically disposed around the chamber 1 to provide a magnetic field between the supporting table 2 and the shower head 16. The ring magnet 21 is rotated by a rotating unit (not shown) such as a motor.

The whole operation of the plasma etching apparatus having the above-described configuration is controlled by a control unit 60. The control unit 60 includes a process controller 61 with a CPU for controlling each component of the plasma etching apparatus; a user interface 62; and a storage unit 63.

An operator can control the plasma etching apparatus by using the user interface 62, wherein the user interface 62 includes a keyboard for allowing the operator to input a command therethrough, a display for showing an operational status of the plasma etching apparatus, and the like.

Moreover, the storage unit 63 stores therein a control program (software) for implementing various processes performed in the plasma etching apparatus under the control of the process controller 61, and/or recipes, each recipe containing processing condition data and the like. The process controller 61 reads out a recipe from the storage unit 63 in accordance with a command from the user interface 62 to execute it, so that a required processing is performed in the plasma etching apparatus under the control of the process controller 61. Further, the control program and the recipe containing processing condition data or the like may be stored in a computer-readable storage medium (such as a hard disk, a compact disk, a flexible disk, a semiconductor memory or the like), or may be transmitted on-line through, for example, a dedicated line from another apparatus as desired.

Hereinafter, a sequence for selectively plasma etching a silicon nitride film against an underlying silicon oxide film on the semiconductor wafer 30 will be described. The gate valve 24 is opened first, and the semiconductor wafer 30 is loaded by a transfer robot (not shown) into the chamber 1 via a load lock chamber (not shown) to be mounted on the supporting table 2. Then, the transfer robot is retreated out of the chamber 1, and the gate valve 24 is closed. Subsequently, the chamber 1 is evacuated via the gas outlet port 19 by the vacuum pump of the gas exhaust system 20.

After the internal pressure of the chamber 1 reaches a predetermined vacuum level, a preset processing gas (etching gas) is supplied into the chamber 1 from the processing gas supply system 15. Then, while the internal pressure of the chamber 1 is controlled to be kept at, e.g., 8.0 Pa, a radio frequency power of, e.g., 100 to 5000 W with a frequency of, e.g., 13.56 MHz is applied to the supporting table 2 from the RF power supply 10. At this time, as a consequence of a preset voltage being applied to the electrode 6a of the electrostatic chuck 6 from the DC power supply 12, the semiconductor wafer 30 is adsorbed to and held by the electrostatic chuck 6 due to the Coulomb force.

By applying the radio frequency power to the supporting table 2 serving as a lower electrode, as described above, an electric field is formed between the shower head 16 serving as an upper electrode and the supporting table 2 serving as the lower electrode. Since a horizontal magnetic field is also formed in an upper portion 1a of the chamber 1 due to the presence of the ring magnet 21, electrons are made to drift, which in turn generates a magnetron discharge in the processing area where the semiconductor wafer 30 is located. Then, the silicon nitride film formed on the semiconductor wafer 30 is etched by the plasma of the processing gas generated due to the magnetron discharge.

Then, upon the completion of the predetermined etching process, the supply of the high frequency power and the processing gas is stopped, and the semiconductor wafer 30 is unloaded from the chamber 1 in a reverse sequence to that described above.

Below, a method for manufacturing a semiconductor device in accordance with the preferred embodiment of the present invention will be described with reference to FIGS.

1A and 1B. FIGS. 1A and 1B are enlarged views showing structures of major parts of a semiconductor wafer as a substrate to be processed. In FIGS. 1A and 1B, reference numeral 101 denotes a silicon substrate constituting the semiconductor wafer. A poly silicon film 102 having a predetermined pattern is formed on and partially covers the silicon substrate 101, and a silicon oxide film (for example, an $SiO_2$ film, an SiOC film, or the like) 103 is formed thereon to cover the poly silicon film 102 and the silicon substrate 101. In the state shown in FIG. 1A, a silicon nitride film (for example, an SiN film) 104 is formed on the silicon oxide film 103 to cover its entire surface.

A plasma etching is performed on the structure shown in FIG. 1A, etching the silicon nitride film 104 such that it remains only around the poly silicon film 102, as illustrated in FIG. 1B. This structure is used, for example, to form a nitride film spacer at a gate of a semiconductor device. Here, the plasma etching is conducted by using an etching gas including a $C_mF_n$ gas (m, n represent integers of 1 or greater) added to a gaseous mixture of at least a $CH_xF_y$ gas (x, y represent integers of 1 or greater) and $O_2$ gas, wherein the flow rate of the $C_mF_n$ gas is no greater than 10% of that of the $O_2$ gas. Optionally, the etching gas may further including a rare gas such as Ar gas or He gas.

For example, $CH_3F$ gas or $CH_2F_2$ gas can be preferably used as the $CH_xF_y$ gas. Further, $C_2F_6$ gas, $C_3F_8$ gas, $C_4F_6$ gas, $C_4F_8$ gas, $C_5F_8$ gas or the like can be preferably employed as the $C_mF_n$ gas. By adding the $C_mF_n$ gas, the silicon nitride film surface can be prevented from becoming rough. However, if the amount of the $C_mF_n$ gas added is too excessive, the selectivity of the silicon nitride film against the silicon oxide film would be decreased. Therefore, the upper limit of the amount of the $C_mF_n$ gas added is set to be not greater than 10% of the flow rate of the $O_2$ gas. Furthermore, in terms of the selectivity of the silicon nitride film against the silicon oxide film, the amount of the $C_mF_n$ gas added is preferably set to be not greater than 8% of the $O_2$ gas, and, more preferably, not greater than 6% of the latter. As for the lower limit of the amount of the $C_mF_n$ gas added, though it may be defined by a lower limit of a control range for a gas flow rate of the plasma etching apparatus (typically, 1 sccm), it is preferable to set the amount of the $C_mF_n$ gas added to be not less than 1% of the flow rate of the $O_2$ gas and, more preferably, not less than 3% of the latter. Further, for example, He gas, Ne gas, Ar gas, Kr gas, Xe gas or the like can be employed as a rare gas serving as a dilution gas.

As an experiment of the present invention, a plasma etching was performed on a semiconductor wafer having a structure as illustrated in FIG. 1A by using the plasma etching apparatus shown in FIG. 2.

The following processing recipe for the plasma etching is read out from the storage unit 63 of the control unit 60 to be executed by the process controller 61, and the processing controller 61 controls each component of the plasma processing apparatus based on a control program. The processing recipe is as follows:

Etching gas: $CH_3F/Ar/O_2/C_4F_8$=60/90/38/2 sccm
Pressure: 8.0 Pa (60 mTorr)
Power: 200 W In the aforementioned plasma etching process, the etching rate of the silicon nitride film (SiN film) was found to be 50.4 nm/min and the selectivity of the silicon nitride film against the underlying silicon oxide film ($SiO_2$ film) (the ratio of the etching rate of the silicon nitride film to the etching rate of the silicon oxide film) was found to be about 11. Further, when observing the surface of the silicon nitride film by means of an electron microscope after the etching, the surface of the silicon nitride film 104 was found to be smooth with no roughness, as shown in FIG. 1B.

Figure 3:
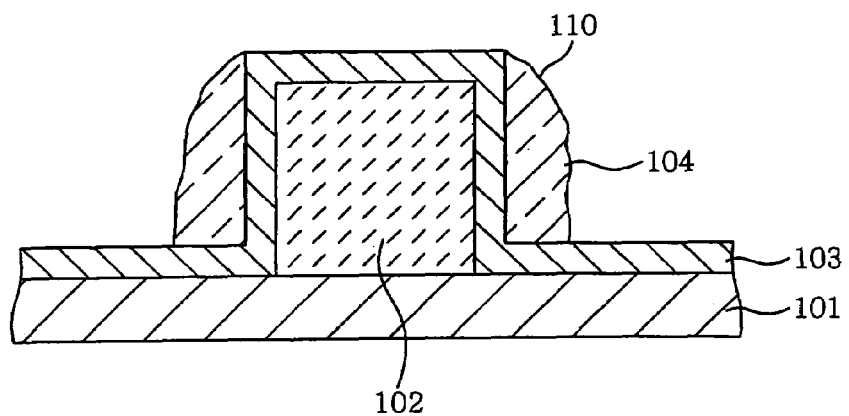
FIG. 3 illustrates a surface state of a silicon nitride film obtained in a comparative experiment.

Meanwhile, as a comparative experiment, a plasma etching was conducted without adding $C_4F_8$ gas to the etching gas in accordance with the following recipe:

Etching gas: $CH_3F/Ar/O_2$=60/90/32 sccm
Pressure: 6.6 Pa (50 mTorr)
Power: 200 W In the comparative experiment, the etching rate of a silicon nitride film (SiN film) was found to be about 37.2 nm/min, and the selectivity of the silicon nitride film against a silicon oxide film ($SiO_2$) film (the ratio of the etching rate of the silicon nitride film to the etching rate of the silicon oxide film) was found to be about 11.0. Also, after the etching, the surface of the silicon nitride film 104 was observed to be rough, covered with irregularities 110, when viewed using the electron microscope as illustrated in FIG. 3.

As can be seen from the above results, no surface roughness was observed on the silicon nitride film when the etching was carried out in accordance with the preferred embodiment of the present invention, as opposed to the one observed in the comparative experiment, while obtaining the same level of selectivity of the silicon nitride film against the silicon oxide film.

As described above, in accordance with the semiconductor device manufacturing method of the present invention, it is possible to prevent a surface roughness of a silicon nitride film in a plasma etching process, while obtaining a high selectivity of the silicon nitride film against the underlying silicon oxide film. Further, it is to be noted that the present invention is not limited to the preferred embodiment described above but may be modified in various ways. For example, the plasma etching apparatus is not limited to the parallel plate type, wherein a radio frequency power is applied to the lower electrode as shown in FIG. 2. Instead, there may be used various parallel plate type plasma etching apparatuses in which two radio frequency powers are applied to the lower electrode or to the upper electrode and the lower electrode, respectively.

While the invention has been shown and described with respect to the preferred embodiments, it will be understood by those skilled in the art that various changes and modifications may be made without departing from the scope of the invention as defined in the following claims.

What is claimed is:

1. A method for manufacturing a semiconductor device, comprising:
    forming a layer of silicon oxide on a substrate;
    forming a layer of silicon nitride over the layer of silicon oxide; and
    subjecting the layer of silicon nitride to a plasma etching gas including $C_mF_n$ gas, $CH_xF_y$ gas and $O_2$ gas for selectively removing the layer of silicon nitride from the layer of the silicon oxide to expose the layer of the silicon oxide,
    wherein m, n, x and y are integers of 1 or greater, respectively, and a flow rate of the $C_mF_n$ gas is not greater than 10% of that of the $O_2$ gas.

2. The method of claim 1, the method further comprising:
    forming a gate on the substrate;
    forming the layer of silicon oxide on the gate;
    forming the layer of silicon nitride on the layer of silicon oxide; and
    plasma etching the layer of silicon nitride to form spacers on sidewalls of the gate.

3. The method of claim 1, wherein the $CH_xF_y$ gas is $CH_3F$ gas or $CH_2F_2$ gas.

4. The method of claim 1, wherein the $C_mF_n$ gas is $C_2F_6$ gas, $C_3F_8$ gas, $C_4F_6$ gas, $C_4F_8$ gas or $C_5F_8$ gas.

5. The method of claim 1, wherein the amount of the flow rate of the $C_mF_n$ gas added is set to be not greater than about 8% of the flow rate of the $O_2$ gas.

6. The method of claim 1, wherein the amount of the flow rate of the $C_mF_n$ gas added is set to be not greater than about 6% of the flow rate of the $O_2$ gas.

7. The method of claim 1, wherein the etching gas further includes a rare gas.

8. A method for manufacturing a semiconductor device, comprising:
 forming a gate on a substrate;
 forming a silicon oxide film on the gate;
 forming a silicon nitride film on the silicon oxide film; and
 subjecting the silicon nitride film to a plasma etching gas including $C_mF_n$ gas, $CH_xF_y$ gas and $O_2$ gas for selectively removing the silicon nitride film from the silicon oxide film to form spacers on sidewalls of the gate;
 wherein m, n, x and y are integers of 1 or greater, respectively, and a flow rate of the $C_mF_n$ gas is not greater than 10% of that of the $O_2$ gas.

9. The method of claim 8, wherein the $CH_xF_y$ gas is $CH_3F$ gas or $CH_2F_2$ gas.

10. The method of claim 8, wherein the $C_mF_n$ gas is $C_2F_6$ gas, $C_3F_8$ gas, $C_4F_6$ gas, $C_4F_8$ gas or $C_5F_8$ gas.

11. A method for manufacturing a semiconductor device, comprising:
 forming a gate on a substrate;
 forming a silicon oxide film on the gate;
 forming a silicon nitride film on the silicon oxide film; and
 subjecting the silicon nitride film to a plasma etching gas including $C_mF_n$ gas, $CH_xF_y$ gas and $O_2$ gas for selectively removing the silicon nitride film from the silicon oxide to form spacers on sidewalls of the gate;
 wherein m, n, x and y are integers of 1 or greater respectively, and a flow rate of the $C_mF_n$ gas is not greater than 10% of that of the $O_2$ gas,
 the plasma etching gas further includes a rare gas; the $CH_xF_y$ gas is $CH_3F$ gas or $CH_2F_2$ gas; and the $C_mF_n$ gas is $C_2F_6$ gas, $C_3F_8$ gas, $C_4F_6$ gas, $C_4F_8$ gas or $C_5F_8$ gas.

12. The method of claim 11, wherein the amount of the flow rate of the flow rate of the $C_mF_n$ gas added is set to be not greater than about 8% of the flow rate of the $O_2$ gas.

13. The method of claim 11, wherein the amount of the flow rate of the flow rate of the $C_mF_n$ gas added is set to be not greater than about 6% of the flow rate of the $O_2$ gas.

* * * * *